(12) United States Patent
Kim et al.

(10) Patent No.: US 8,102,293 B2
(45) Date of Patent: Jan. 24, 2012

(54) DIGITAL DIRECT CONVERSION RECEIVING APPARATUS AND METHOD

(75) Inventors: Hyung Jung Kim, Daejeon (KR); Jae Hyung Kim, Gyeongsangnam-do (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/567,203

(22) Filed: Sep. 25, 2009

(65) Prior Publication Data

US 2010/0156690 A1 Jun. 24, 2010

(30) Foreign Application Priority Data

Dec. 22, 2008 (KR) ......................... 10-2008-0130893

(51) Int. Cl.
*H03M 1/12* (2006.01)
(52) U.S. Cl. ........ 341/155; 341/118; 341/120; 341/142; 455/302; 455/304; 455/305; 455/306; 455/324; 375/316; 375/324; 375/350
(58) Field of Classification Search .................. 455/302, 455/304, 305, 306, 324; 375/316, 324, 350; 341/110, 118, 120, 142, 155
See application file for complete search history.

(56) References Cited

U.S. PATENT DOCUMENTS

| | | | | |
|---|---|---|---|---|
| 5,612,975 A * | 3/1997 | Becker et al. | ................. | 375/319 |
| 6,304,751 B1 * | 10/2001 | King | ............................. | 455/306 |
| 6,574,459 B1 * | 6/2003 | Kaminski et al. | ............. | 455/272 |
| 6,631,256 B2 * | 10/2003 | Suominen | ...................... | 455/302 |
| 6,864,818 B1 * | 3/2005 | Hezar | ........................... | 341/143 |
| 7,061,409 B1 * | 6/2006 | Jantti et al. | ...................... | 341/61 |
| 7,173,980 B2 * | 2/2007 | Masenten et al. | ............. | 375/316 |
| 7,362,826 B2 * | 4/2008 | Willingham | ................... | 375/327 |
| 7,373,131 B2 * | 5/2008 | Matsuno | ....................... | 455/302 |
| 7,672,655 B1 * | 3/2010 | Cousinard | ..................... | 455/285 |
| 7,773,965 B1 * | 8/2010 | Van Brunt et al. | ......... | 455/226.1 |
| 7,778,618 B2 * | 8/2010 | Lu et al. | ..................... | 455/234.2 |
| 2006/0135102 A1 * | 6/2006 | Lee et al. | ................... | 455/232.1 |
| 2006/0246842 A1 * | 11/2006 | Mohindra | .................... | 455/63.1 |
| 2006/0281429 A1 * | 12/2006 | Kishi et al. | .................... | 455/313 |
| 2007/0060077 A1 | 3/2007 | Qian | | |
| 2009/0131006 A1 * | 5/2009 | Wu | .............................. | 455/257 |

FOREIGN PATENT DOCUMENTS

| | | |
|---|---|---|
| JP | 2001-045081 | 2/2001 |
| JP | 2008-187349 | 8/2008 |
| KR | 10-0735326 | 6/2007 |
| WO | 2007/086020 | 8/2007 |

OTHER PUBLICATIONS

Japanese Office Action issued Jul. 1, 2011 in corresponding Japanese Patent Application No. 2009-234210.

\* cited by examiner

*Primary Examiner* — Linh Nguyen

(74) *Attorney, Agent, or Firm* — Staas & Halsey LLP

(57) ABSTRACT

A digital direct conversion receiving apparatus, including: a phase conversion unit to down-convert a Radio Frequency (RF) signal into a plurality of sample signals, and generate a certain phase difference among the plurality of sample signals when the RF signal is down-converted; and a variable complex gain unit to remove an image component from the plurality of sample signals using the generated phase difference.

20 Claims, 7 Drawing Sheets

DIGITAL DIRECT CONVERSION RECEIVING APPARATUS AND METHOD

CROSS-REFERENCE TO RELATED APPLICATION

This application claims the benefit of Korean Patent Application No. 10-2008-0130893, filed on Dec. 22, 2008, in the Korean Intellectual Property Office, the disclosure of which is incorporated herein by reference.

BACKGROUND

1. Field

Example embodiments relate to a digital direct conversion receiving apparatus and method.

2. Description of the Related Art

When a Radio Frequency (RF) signal which is an analog signal is received, a sampling frequency which is at least twice a carrier frequency is required to enable an existing sampling theory to be applied. In general, however, a bandwidth where a signal exists may be 0.003 to 0.2% of a carrier frequency. Accordingly, a sampling scheme based on a carrier frequency may be ineffective and affect a digital domain due to a significant amount of data.

A Band-Pass Sampling (BPS) scheme has been provided to overcome such disadvantages. In a BPS scheme, a sampling frequency may be determined by a bandwidth of a signal without depending on a carrier frequency. Accordingly, an effective system may be structured. A BPS scheme digitally processes an input signal, using a small bandwidth and may be referred to as a digital direct conversion scheme or an RF direct conversion scheme. Also, the BPS scheme may be referred to as a band-pass sampling, a harmonic sampling, or a sub-sampling.

A digital direct conversion scheme may generate an aliasing by applying a lower sampling frequency, and have a sampling rate based on a bandwidth of a signal including information. A digital direct conversion scheme may be applied to a configuration of a receiving apparatus based on an analog down-conversion function being replaced with sampling. Also, a digital direct conversion scheme may perform sampling with respect to a signal received through an antenna, directly after passing a Low Noise Amplifier (LNA). Accordingly, an inexpensive and small wireless receiving apparatus may be provided.

A $1^{st}$-order BPS receiver may down-convert a signal, corresponding to an integer-position between a carrier frequency and a signal bandwidth, at a minimum sampling rate ($f_S$=2B) being twice a bandwidth (B). Also, a $1^{st}$-order BPS receiver may down-convert a signal, corresponding to a non-integer position between a carrier frequency and a signal bandwidth, at the minimum sampling rate ($f_S$>2B) greater than twice the bandwidth. However, since a sampling frequency ($f_S$) may vary depending on a location of a signal band, the $1^{st}$-order BPS receiver is required to change the sampling rate depending on a bandwidth of a signal and a location of a band for universal access. Also, a bandwidth of an RF filter is to be varied.

A $2^{nd}$-order BPS receiver may remove an aliasing through a signal processing, after sampling a signal with a time delay using two paths to overcome the above-described disadvantages. Accordingly, the $2^{nd}$-order BPS receiver may select a sampling rate without considering the aliasing, and thereby may select a minimum sampling frequency identical to a bandwidth of a signal.

However, when a sampling rate of an input stream is identical to a bandwidth (B), an interpolant of a $2^{nd}$-order BPS receiver may reproduce a sample at the sampling rate of B, and thus an aliasing may be generated. Accordingly, a $2^{nd}$-order BPS receiver may be operated in only integer positions, and may be required to reconfigure an interpolant depending on a location of a signal band.

SUMMARY

Example embodiments may provide a digital direct conversion receiving apparatus and method which may perform universal access by reconstructing a signal processing algorithm without a hardware change of the digital direct conversion receiving apparatus, when a arbitrary signal in a Radio Frequency (RF) band is down-converted.

Example embodiments may also provide a digital direct conversion receiving apparatus and method which may perform an RF direct conversion with respect to a non-integer position signal as well as an integer position signal.

Example embodiments may also provide a digital direct conversion receiving apparatus and method which may generate clock signals having a time difference, generate a certain phase difference among sample streams, and thereby may remove an image component from the sample streams.

Example embodiments may also provide a digital direct conversion receiving apparatus and method which may enable a digitization unit to be operated at a sampling rate being at least twice as wide as a bandwidth of an RF signal, enable only an $n^{th}$ copy component of spectrum copy components generated by sampling to be shown in a baseband, and thereby may use an identical interpolant.

Example embodiments may also provide a digital direct conversion receiving apparatus and method which may down-convert an RF signal into an intermediate frequency band adjacent to a frequency of '0', and thereby may avoid an effect of a Direct Current (DC) offset.

According to example embodiments, there may be provided a digital direct conversion receiving apparatus, including: a phase conversion unit to down-convert a Radio Frequency (RF) signal into a plurality of sample signals, and generate a certain phase difference among the plurality of sample signals when the RF signal is down-converted; and a variable complex gain unit to remove an image component from the plurality of sample signals using the generated phase difference.

The digital direct conversion receiving apparatus may further include a clock generation unit to generate clock signals having different time differences, and the phase conversion unit may generate the phase difference using the generated clock signals.

The digital direct conversion receiving apparatus may further include a digitization unit to digital-convert the plurality of sample signals with the generated phase difference, and generate sample streams with different phase differences, and the variable complex gain unit may combine the generated sample streams and remove the image component with a negative frequency band from the combined sample streams.

The phase conversion unit may down-convert the RF signal into an intermediate frequency band adjacent to a frequency of '0' to generate the plurality of sample signals.

The phase conversion unit may down-convert the RF signal into the plurality of sample signals using a predetermined sampling frequency.

The sampling frequency may be set to be at least twice as wide as a bandwidth of the RF signal.

The digital direct conversion receiving apparatus may further include a filter to select the RF signal from signals received from an antenna, the filter may have a bandwidth of the selected RF signal, and include a tunable filter or a fixed filter.

The variable complex gain unit may include a 1-tap Finite Impulse Response (FIR) filter.

According to other example embodiments, there may be provided a digital direct conversion receiving apparatus, including: a phase conversion unit to insert different phase information to a plurality of sample signals, when an RF signal is down-converted into the plurality of sample signals; and a complex interpolant to remove an aliasing component from the plurality of sample signals using the phase information.

The digital direct conversion receiving apparatus may further include a clock generation unit to generate clock signals having different time differences, and the phase conversion unit may down-convert the RF signal into the plurality of sample signals including the phase information, using the generated clock signals.

The digital direct conversion receiving apparatus may further include a digitization unit to digital-convert the plurality of sample signals including the phase information, and generate sample streams with a certain phase difference, and the complex interpolant may combine the generated sample streams and remove an image component with a negative frequency band from the combined sample streams.

The digitization unit may perform digital conversion at a sampling rate which is at least twice as wide as a bandwidth of the RF signal.

The phase conversion unit may down-convert the RF signal into an intermediate frequency band adjacent to a frequency of '0' to generate the plurality of sample signals.

The complex interpolant may process a baseband signal where the aliasing component is removed, as a complex signal.

According to example embodiments, there may be provided a digital direct conversion receiving method, including: down-converting an RF signal into a plurality of sample signals, and generating a certain phase difference among the plurality of sample signals when the RF signal is down-converted; and removing an image component from the plurality of sample signals using the generated phase difference.

The digital direct conversion receiving method may further include generating clock signals having different time differences, and the generating of the certain phase difference may include generating the phase difference using the generated clock signals.

The digital direct conversion receiving method may further include digital-converting the plurality of sample signals with the generated phase difference, and generating sample streams with different phase differences, and the removing of the image component may include combining the generated sample streams and removing the image component with a negative frequency band from the combined sample streams.

The generating of the sample streams may include performing digital conversion at a sampling rate which is at least twice as wide as a bandwidth of the RF signal.

The generating of the certain phase difference may include down-converting the RF signal into an intermediate frequency band adjacent to a frequency of '0' to generate the plurality of sample signals.

According to example embodiments, a digital direct conversion receiving apparatus and method may perform universal access by reconstructing a signal processing algorithm without a hardware change of the digital direct conversion receiving apparatus, when a arbitrary signal in a Radio Frequency (RF) band is down-converted.

Also, according to example embodiments, a digital direct conversion receiving apparatus and method may perform an RF direct conversion with respect to a non-integer position signal as well as an integer position signal.

Also, according to example embodiments, a digital direct conversion receiving apparatus and method may generate clock signals having a time difference, generate a certain phase difference among sample streams, and thereby may remove an image component from the sample streams.

Also, according to example embodiments, a digital direct conversion receiving apparatus and method may enable a digitization unit to be operated at a sampling rate being at least twice as wide as a bandwidth of an RF signal, enable only an $n^{th}$ copy component of spectrum copy components generated by sampling to be shown in a baseband, and thereby may use an identical interpolant.

Also, according to example embodiments, a digital direct conversion receiving apparatus and method may down-convert an RF signal into an intermediate frequency band adjacent to a frequency of '0', and thereby may avoid an effect of a Direct Current (DC) offset.

Additional aspects of the example embodiments will be set forth in part in the description which follows and, in part, will be apparent from the description, or may be learned by practice of the embodiments.

BRIEF DESCRIPTION OF THE DRAWINGS

These and/or other aspects will become apparent and more readily appreciated from the following description of the example embodiments, taken in conjunction with the accompanying drawings of which.

DETAILED DESCRIPTION

Figure 1:
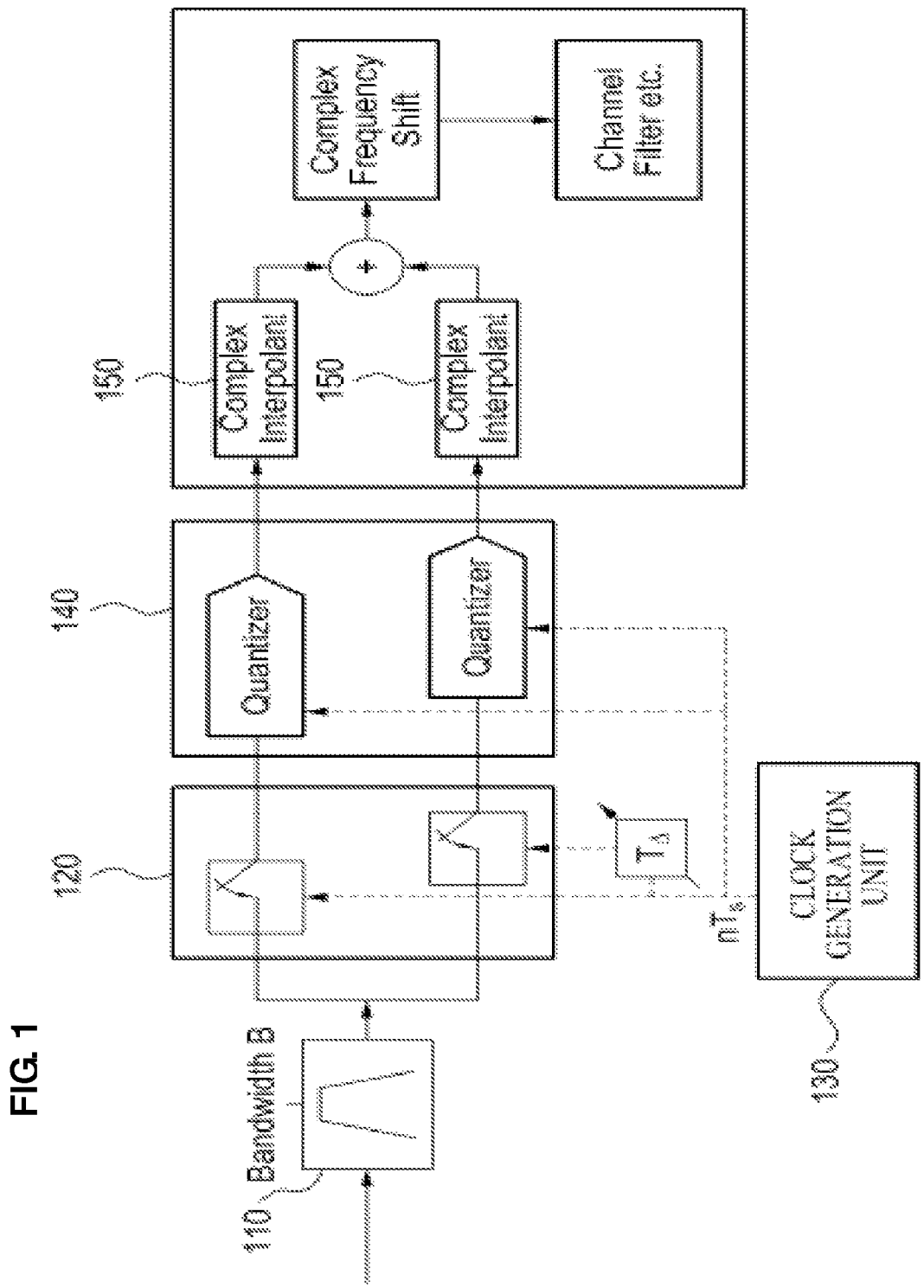
FIG. 1 illustrates a configuration of a digital direct conversion receiving apparatus according to example embodiments.

Reference will now be made in detail to example embodiments, examples of which are illustrated in the accompanying drawings, wherein like reference numerals refer to the like elements throughout. Example embodiments are described below to explain the present disclosure by referring to the figures.

FIG. 1 illustrates a digital direct conversion receiving apparatus according to example embodiments.

The digital direct conversion receiving apparatus may include a tunable Radio Frequency (RF) filter 110, a phase conversion unit 120, a clock generation unit 130, a digitization unit 140, and a complex interpolant 150.

The tunable RF filter 110 may select only an RF signal to be down-converted, from RF signals received from an antenna, and remove an aliasing component and a noise of the selected RF signal. That is, the tunable RF filter 110 may function as a Low Noise Amplifier (LNA) and a Band-Pass Filter (BPF).

The tunable RF filter 110 may have a baseband of the selected RF signal. Although a desirable RF signal may be selected using the tunable RF filter 110 variably selecting a frequency band through a voltage control according to example embodiments, a fixed filter may be also used.

The phase conversion unit 120 may down-convert the RF signal into a plurality of sample signals using a predetermined sampling frequency. The sampling frequency may be set to be at least twice as wide as a bandwidth (2B) of the RF signal. Also, a sampling frequency may indicate a sampling rate.

The phase conversion unit 120 may down-convert the RF signal into an intermediate frequency (IF) band adjacent to a frequency of '0' to generate the plurality of sample signals. Accordingly, the phase conversion unit 120 may avoid an effect of a Direct Current (DC) offset, and the like. Also, an environment, that may remove an image component after an RF signal in a random band is down-converted, may be provided without an integer position between a bandwidth and a carrier frequency as a condition.

The phase conversion unit 120 may generate a certain phase difference among the plurality of sample signals when the RF signal is down-converted. For this, the phase conversion unit 120 may generate the certain phase difference among the plurality of sample signals using clock signals. The clock generation unit 130 may generate the clock signals having different phase differences.

In this instance, the phase conversion unit 120 may generate the phase difference among the plurality of down-converted sample signals regardless of a Nyquist zone where the RF signal is located.

According to example embodiments, the phase conversion unit 120 may be embodied as two Track & Holders. The two Track & Holders may receive clock signals having a relative time difference of $T_A$ from the clock generation unit 130, and generate two sample signals having the time difference of $T_A$. Accordingly, a phase difference between the two sample signals may be generated.

The clock generation unit 130 may generate the clock signals having different time differences. The clock generation unit 130 may distribute the generated clock signals into the phase conversion unit 120 and the digitization unit 140. According to example embodiments, the clock generation unit 130 may be embodied as a crystal oscillator, a voltage control oscillator (VCO), a direct digital synthesizer (DDS), and the like.

The quantum conversion unit 140 may digital-convert the plurality of sample signals with the generated phase difference and generates sample streams with different phase differences. That is, the digitization unit 140 may generate the sample streams from the down-converted sample signals, and transmit the sample streams to the complex interpolant 150. The sample streams may include information about the phase differences.

The digitization unit 140 may function as a quantizer. Also, the digitization unit 140 may be operated at a sampling rate which is at least twice as wide as a bandwidth of the RF signal. Only an $n^{th}$ copy component of spectrum copy components generated by sampling may be shown in a baseband of $-B<f<B$. Accordingly, signals in a band of $(n-1/2)f_s<f<(n+1/2)f_s$ may repeatedly use an identical interpolant.

The complex interpolant 150 may remove an image component from the sample streams using the generated phase difference. In this instance, the complex interpolant 150 may combine the sample streams and remove an image component with a negative frequency band from the combined sample streams.

Figure 2:
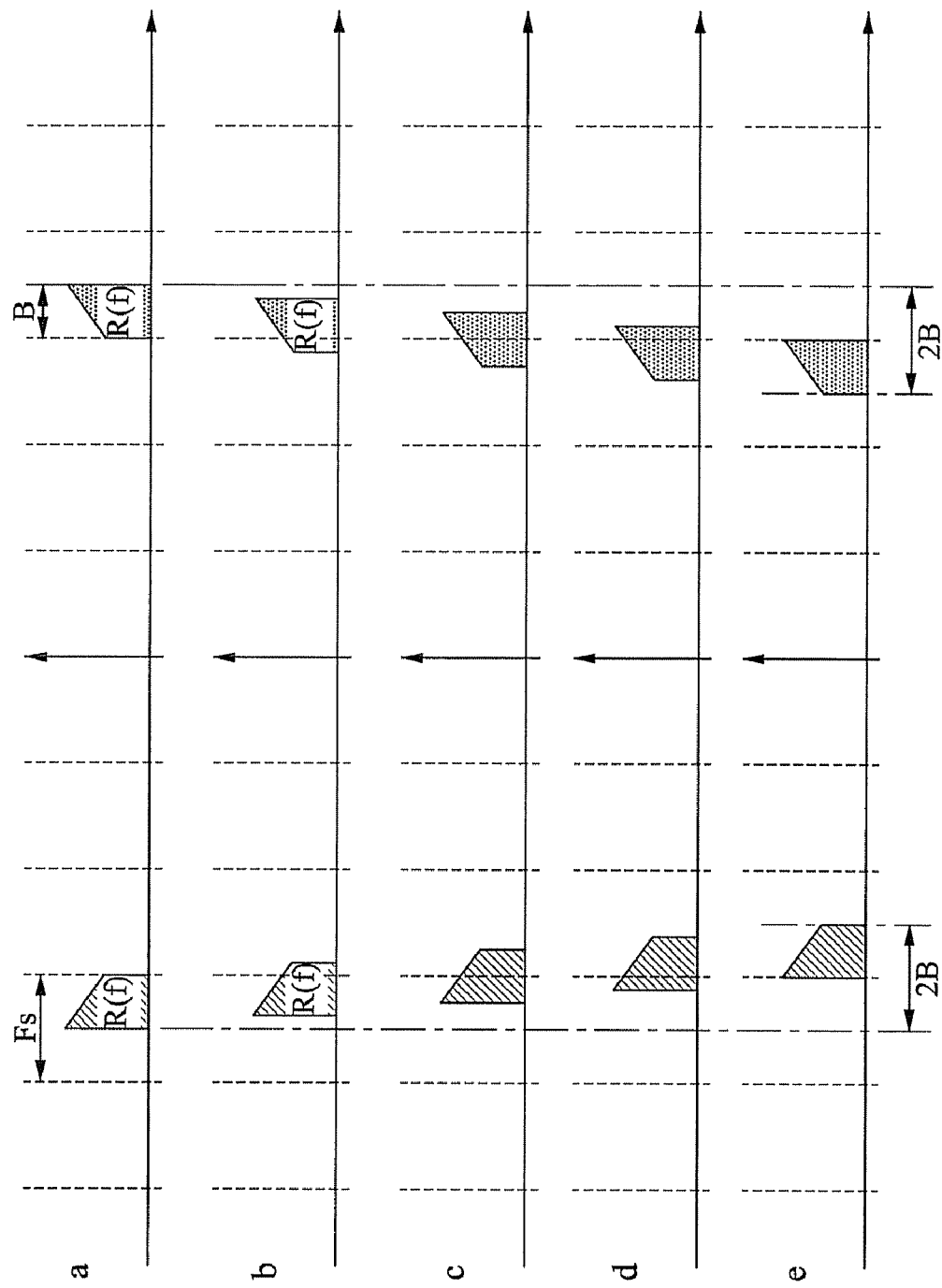
FIG. 2 illustrates an example of a Radio Frequency (RF) signal converted to have an identical phase delay, according to example embodiments.

FIG. 2 illustrates an example of an RF signal converted to have an identical phase delay according to example embodiments.

It is illustrated in FIG. 2 that a tunable RF filter may select signals located in a band of $(n-1/2)f_s<f<(n+1/2)f_s$. When the signals located in the band are sampled at $f_s=2B$, a positive frequency component, that is, a $p=n^{th}$ spectrum of $R_{A+}^{\delta 2}(f)$, $R_{B+}^{\delta 2}(f)$ may be shown in a baseband of $(-B<f<B)$, and a negative frequency component, that is, a $p=-n^{th}$ spectrum of $R_{A+}^{\delta 2}(f)$, $R_{B+}^{\delta 2}(f)$ may be shown in the baseband of $(-B<f<B)$. In this instance, a phase shift of $\phi_n=-2\pi n T_A f_s = -2\pi n T_A(2B)$ may occur in a stream B, and RF signals having an identical n value may also have an identical phase shift. Accordingly, signals in the band of $(n-1/2)f_s<f<(n+1/2)f_s$ may remove an image component using an identical interpolant.

Figure 3:
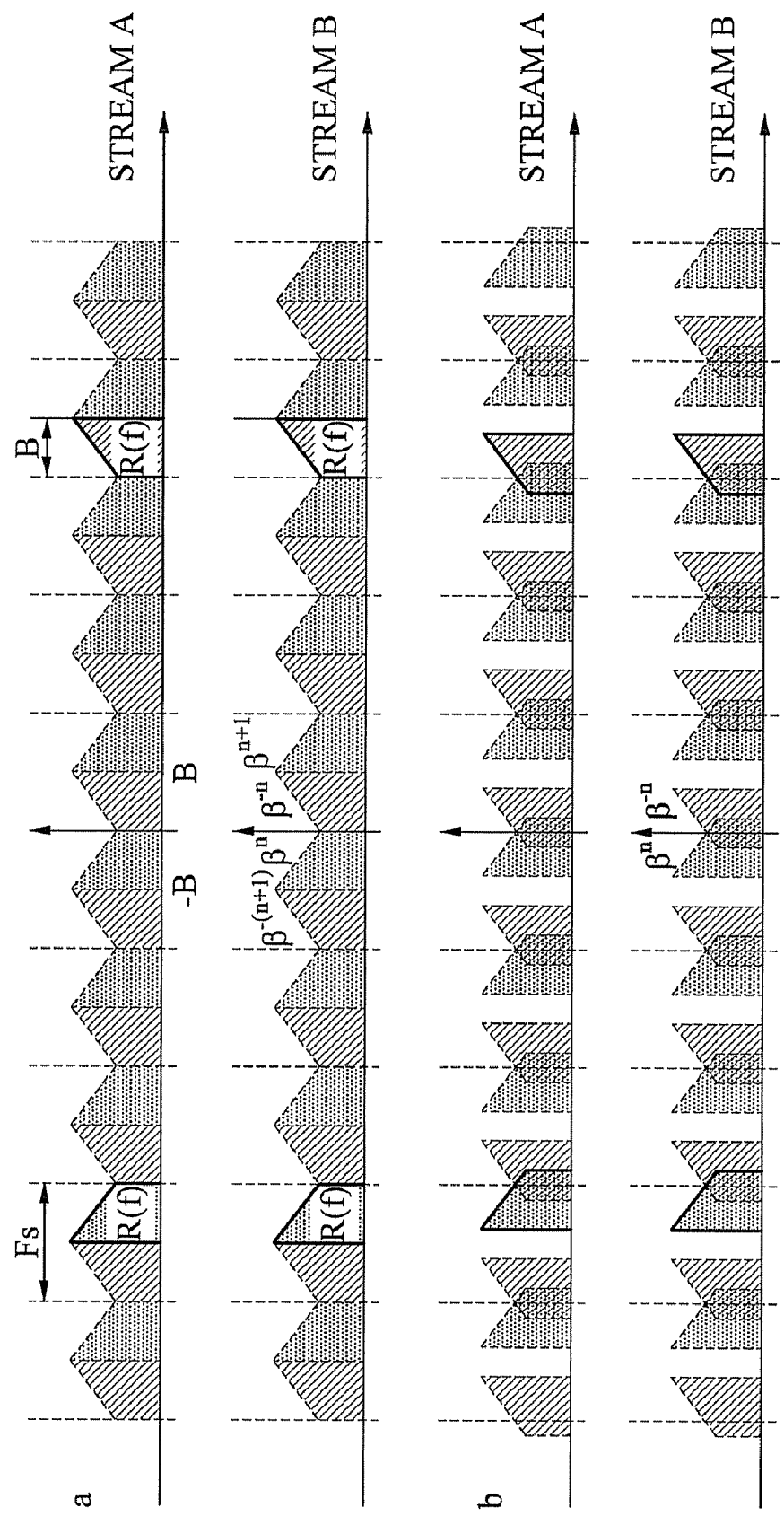
FIG. 3 illustrates an example of a sample stream having a phase difference, according to example embodiments.

FIG. 3 illustrates an example of a sample stream with a phase difference according to example embodiments.

Output spectrums of two Analog-to-Digital Converters (ADCs) are illustrated in FIG. 3, when RF spectrums are located as illustrated in output a and output b of FIG. 3. The output spectrums of the two ADCs may be sampled at $f_s=2B$. A sample stream B may have a relative phase delay with respect to a sample stream A, and the phase delay may vary depending on a Nyquist zone where an RF signal is located. When a bandwidth of a signal in a band of $(n-1/2)f_s<f<(n+1/2)f_s$ is limited to a bandwidth of B, a phase shift of $\phi_n=-2\pi n T_A(2B)$ may occur in a baseband of $-B<f<B$ of the sample stream B. A complex interpolant may shift a phase of the sample stream B, that is, $R_B^{\delta 2}(f)$, by $-\beta^{-n}$, and add the sample stream A to the shifted phase of the sample stream B. Accordingly, an image component which is an aliasing component may be removed from a negative frequency band. Here, the sample stream A and the sample stream B may be generated by a digitization unit 140 of FIG. 1.

Figure 4:
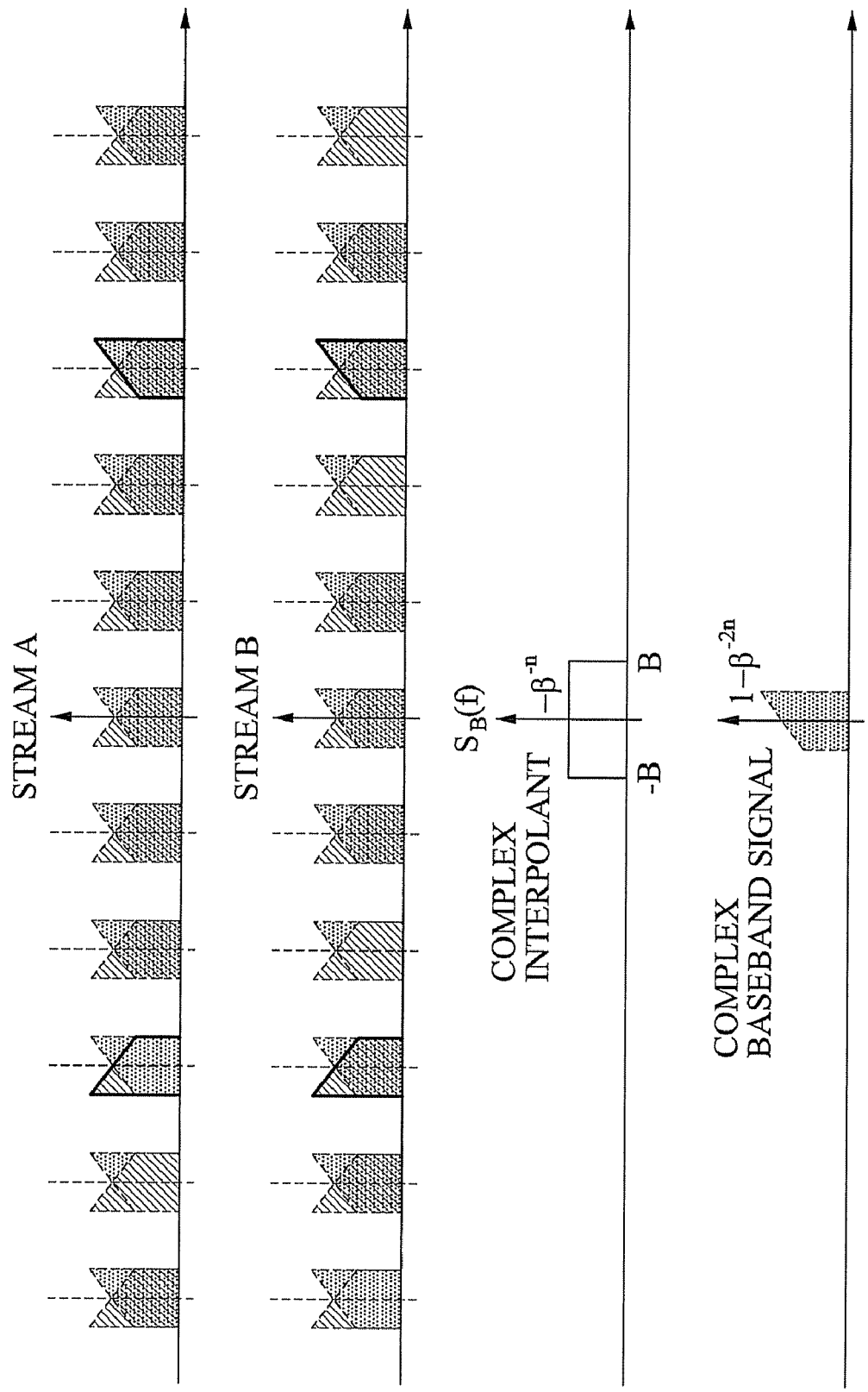
FIG. 4 illustrates an example of removing an image component of a sample stream using a complex interpolant, according to example embodiments.

FIG. 4 illustrates an example of removing an image component of a sample stream using a complex interpolant according to example embodiments.

FIG. 4 illustrates a spectrum when an RF signal located as illustrated in output e of FIG. 2 is sampled at a sampling frequency of $f_s=2B$. To remove an image component which is an aliasing component from a negative frequency band, when $S_A(f)$ and $S_B(f)$ are applied to the complex interpolant, an output may be obtained and represented as, $$R^{\delta 2}(f)=S_A(f)\cdot R_A^{\sigma 2}(f)+S_B(f)\cdot R_B^{\sigma 2}(f) \quad \text{[Equation 1]}$$

where $R^{\delta 2}(f)$ may denote a frequency spectrum of an RF signal which is band-pass sampled by a $2^{nd}$-order Band-Pass Sampling (BPS) receiver. Also, $R_A^{\delta 2}(f)$ may denote a frequency spectrum of a sample stream A, and $R_B^{\delta 2}(f)$ may denote a frequency spectrum of a sample stream B.

To remove the image component which is a negative frequency component, Equation 1 may be equivalent to, $$B\cdot[S_A(f)\cdot R_{A+}^{\delta 2}(f)+S_B(f)\cdot R_{B+}^{\delta 2}(f)]=C\cdot R_{A+}(f-2nB)$$

$$B\cdot[S_A(f)\cdot R_{A-}^{\delta 2}(f)+S_B(f)\cdot R_{B-}^{\delta 2}(f)]=0 \quad \text{[Equation 2]}$$

where B, C, and $R_{A+}^{\delta 2}(f-2nB)$ may denote a signal bandwidth of the RF signal, an arbitrary complex constant, and a positive frequency spectrum of the RF signal shifted to a baseband, respectively.

Equation 3 may be assumed to solve Equation 2. In this case, Equation 4 is to be satisfied in an environment of $|f|<B$ to remove the image component. Accordingly, $S_B(f)$ may be given according to Equation 5 below.

$$S_A(f) = \begin{cases} 1/B & |f|<B \\ 0 & \text{otherwise} \end{cases} \qquad \text{[Equation 3]}$$

$$R_{A+}^{\delta 2}(f) + B \cdot S_B(f) \cdot R_{B+}^{\delta 2}(f) = C \cdot R_{A+}(f-2nB) \qquad \text{[Equation 4]}$$
$$R_{A-}^{\delta 2}(f) + B \cdot S_B(f) \cdot R_{B-}^{\delta 2}(f) = 0$$

$$S_B(f) = \begin{cases} \dfrac{-\beta^{-n}}{B} & |f|<B \\ 0 & \text{otherwise} \end{cases} \qquad \text{[Equation 5]}$$

where $\beta = e^{-j2\pi T_\Delta f_s} = e^{-j2\pi T_\Delta(2B)}$ may denote a phase difference between the sample stream A and the sample stream B.

As described above, since a bandwidth of $S_B(f)$ may be a maximum B (bandwidth of the RF signal), an impulse response may be sampled at $f_s=2B$, and a digital interpolant may be embodied. However, since the digital interpolant may be embodied as the complex interpolant 150 of FIG. 1, a baseband signal where the image component is removed may be used as a complex signal.

Figure 5:
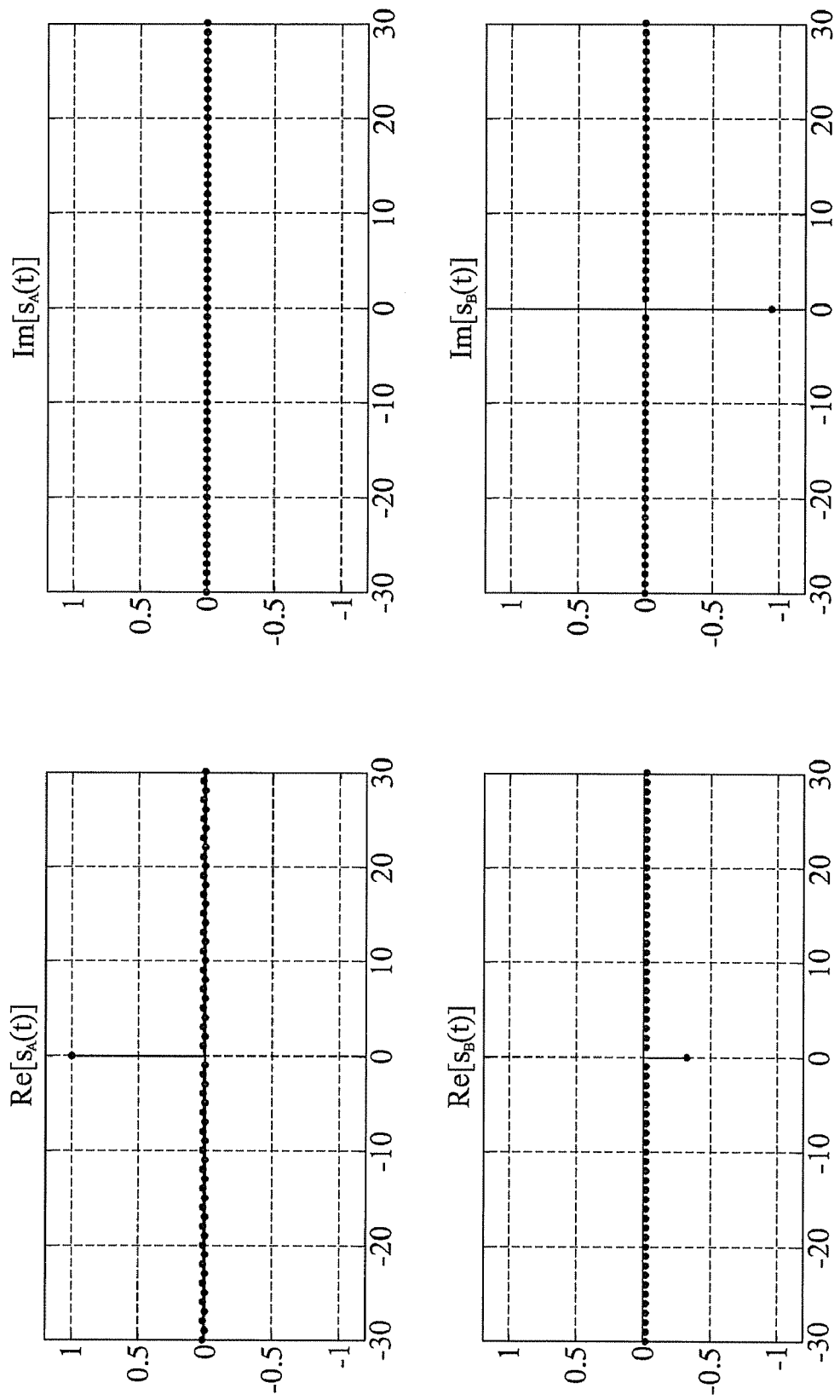
FIG. 5 illustrates an example of a filter coefficient for embodying a digital interpolant when a band of an interpolant filter corresponds to $|f|<B$, according to example embodiments.
Figure 6:
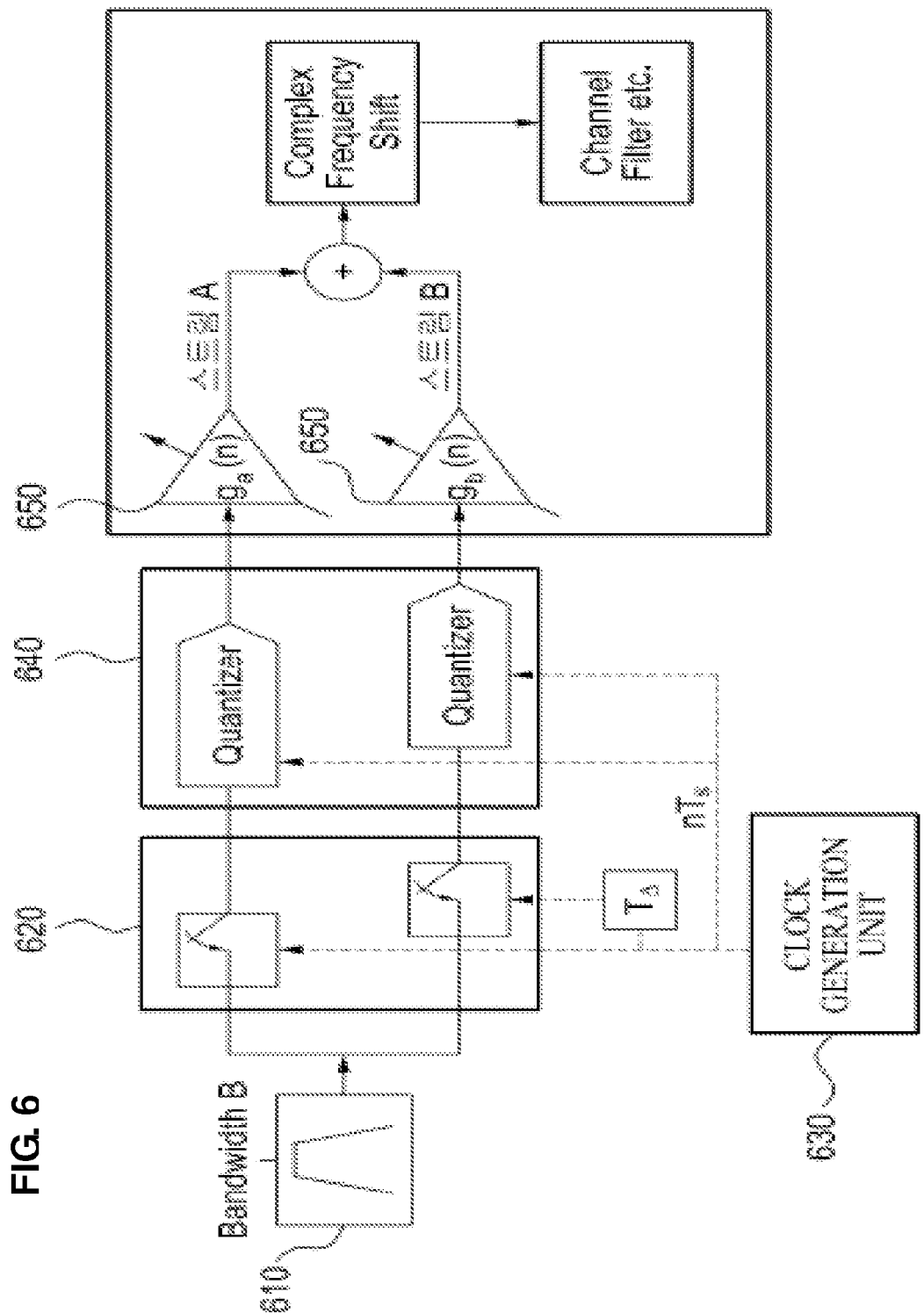
FIG. 6 illustrates a configuration of a digital direct conversion receiving apparatus according to other example embodiments.

FIG. 5 illustrates an example of a filter coefficient to embody the digital interpolant when a band of an interpolant filter corresponds to $|f|<B$ according to example embodiments. FIG. 6 illustrates a configuration of a digital direct conversion receiving apparatus according to other example embodiments.

When a bandwidth of the digital interpolant is fixed as $|f|<B$, remaining coefficients excluding 1-tap in a filter sampled at $T_S=1/2B$, may be '0' as illustrated in FIG. 5. Accordingly, the complex interpolant 150 may be replaced with a variable complex gain unit 650 or an 1-tap Finite Impulse Response (FIR) filter. Further detailed descriptions will be omitted herein, since a tunable RF filter 610, a phase conversion unit 620, a clock generation unit 630, and a digitization unit 640 may be identical or similar to the tunable RF filter 110, the phase conversion unit 120, the clock generation unit 130, and the digitization unit 140 described with reference to FIG. 1.

According to other example embodiments, when down-converting, the digital direct conversion receiving apparatus may fix a time delay $T_A$ of a stream B as a small value that may disregard a group delay. Also, the complex interpolant 150, that is, a variable interpolant filter, may be embodied as a variable complex gain unit 650. Accordingly, the digital direct conversion receiving apparatus may select a desirable band from broadband RF signals and perform down-conversion using a fixed delay and a variable complex gain scheme.

Figure 7:
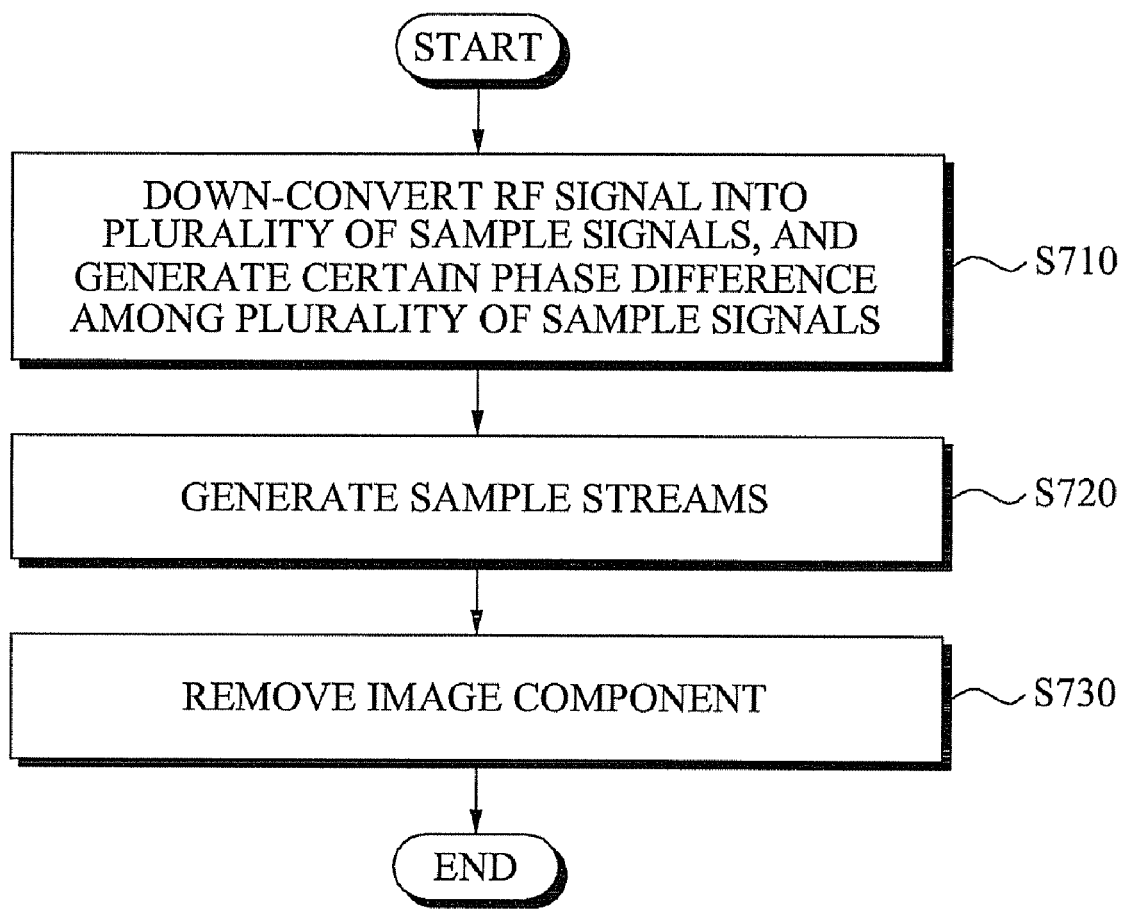
FIG. 7 illustrates a flowchart of a digital direct conversion receiving method according to example embodiments.

FIG. 7 illustrates a flowchart of a digital direct conversion receiving method according to example embodiments. The digital direct conversion receiving method may be embodied by a digital direct conversion receiving apparatus described with reference to FIGS. 1 through 6.

Referring to FIG. 7, the digital direct conversion receiving apparatus may select only an RF signal to be down-converted, from RF signals received through an antenna.

In operation S710, the digital direct conversion receiving apparatus may down-convert an RF signal into a plurality of sample signals using a predetermined sampling frequency, and generate a certain phase difference among the plurality of sample signals when the RF signal is down-converted. For this, the digital direct conversion receiving apparatus may insert clock signals, having different time differences, in the RF signal, to generate the certain phase difference among the plurality of sample signals. Here, the sampling frequency may be set to be at least twice as wide as a bandwidth of the RF signal.

In this instance, the digital direct conversion receiving apparatus may down-convert the RF signal into an IF band adjacent to a frequency of '0' to generate the plurality of sample signals. Accordingly, the digital direct conversion receiving apparatus may avoid an effect of a DC offset, and the like. Also, an environment, that may remove an image component after an RF signal in a arbitrary band is down-converted, may be provided without an integer position between a bandwidth and a carrier frequency as a condition.

In operation S720, the digital direct conversion receiving apparatus may digital-convert the plurality of sample signals with the generated phase difference, and generate sample streams with different phase differences. That is, the digital direct conversion receiving apparatus may generate the sample streams including information about the phase difference from the down-converted sample signals. In this instance, the digital direct conversion receiving apparatus may be operated at a sampling rate which is at least twice as wide as a bandwidth of the RF signal. Only an $n^{th}$ copy component of spectrum copy components generated by sampling may be shown in a baseband of $-B<f<B$. Accordingly, an identical interpolant may be repeatedly used in a band of $(n-1/2)f_s<f<(n+1/2)f_s$.

In operation S730, the digital direct conversion receiving apparatus may remove an image component from the sample streams using the generated phase difference. The digital direct conversion receiving apparatus may combine the generated sample streams, and remove the image component with a negative frequency band from the combined sample streams.

The digital direct conversion receiving method according to the above-described example embodiments may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described example embodiments, or vice versa.

Although a few example embodiments have been shown and described, it would be appreciated by those skilled in the art that changes may be made in these example embodiments without departing from the principles and spirit of the disclosure, the scope of which is defined in the claims and their equivalents.

What is claimed is:

1. A digital direct conversion receiving apparatus, comprising:
    a phase conversion unit to down-convert a Radio Frequency (RF) signal into a plurality of discrete or digital sampled signals in two tracks, and generate a certain phase difference among the plurality of discrete or digital sampled signals when the RF signal is down-converted by using sample clock signals that are variably offset in time between the tracks; and variable complex gain unit to remove an image component from the plurality of sample signals using the generated phase difference.

2. The digital direct conversion receiving apparatus of claim 1, further comprising:
a clock generation unit to generate the clock signals having different time differences,
wherein the phase conversion unit generates the phase difference using the generated clock signals.

3. The digital direct conversion receiving apparatus of claim 1, further comprising:
a digitization unit to quantize the plurality of sampled signals with the generated phase difference, and generate sample streams with different phase differences,
wherein the variable complex gain unit combines the generated sample streams and removes the image component with a negative frequency band from the combined sample streams.

4. The digital direct conversion receiving apparatus of claim 1, wherein the phase conversion unit generates the phase difference among the plurality of down-converted sampled signals regardless of a Nyquist zone where the RF signal is located.

5. The digital direct conversion receiving apparatus of claim 1, wherein the phase conversion unit down-converts the RF signal into an intermediate frequency band adjacent to a frequency of '0' to generate the plurality of sample signals.

6. The digital direct conversion receiving apparatus of claim 1, wherein the phase conversion unit down-converts the RF signal into the plurality of sampled signals using a predetermined sampling frequency.

7. The digital direct conversion receiving apparatus of claim 6, wherein the sampling frequency is set to be at least twice as wide as a bandwidth of the RF signal.

8. The digital direct conversion receiving apparatus of claim 1, further comprising:
a filter to select the RF signal from signals received from an antenna, the filter having a bandwidth of the selected RF signal,
wherein the filter includes a tunable filter or a fixed filter.

9. The digital direct conversion receiving apparatus of claim 1, wherein the variable complex gain unit includes a 1-tap Finite Impulse Response (FIR) filter.

10. A digital direct conversion receiving apparatus, comprising:
a phase conversion unit to insert different phase information to a plurality of discrete or digital sampled signals in two tracks, when an RF signal is down-converted into the plurality of discrete or digital sampled signals by using sample clock signals that are variably offset in time between the tracks; and
a complex interpolant to remove an aliasing component from the plurality of sampled signals using the phase information.

11. The digital direct conversion receiving apparatus of claim 10, further comprising:
a clock generation unit to generate the clock signals having different time differences,
wherein the phase conversion unit down-converts the RF signal into the plurality of sampled signals including the phase information, using the generated clock signals.

12. The digital direct conversion receiving apparatus of claim 10, further comprising:
a digitization unit to quantize the plurality of sample signals including the phase information, and generate sample streams with a certain phase difference,
wherein the complex interpolant combines the generated sample streams and removes an image component with a negative frequency band from the combined sample streams.

13. The digital direct conversion receiving apparatus of claim 12, wherein the digitization unit performs quantization at a sampling rate which is at least twice as wide as a bandwidth of the RF signal.

14. The digital direct conversion receiving apparatus of claim 10, wherein the phase conversion unit down-converts the RF signal into an Intermediate Frequency (IF) band adjacent to a frequency of '0' to generate the plurality of sampled signals.

15. The digital direct conversion receiving apparatus of claim 10, wherein the complex interpolant processes a baseband signal where the aliasing component is removed, as a complex signal.

16. A digital direct conversion receiving method, comprising:
down-converting an RF signal into a plurality of discrete or digital sampled signals in two tracks, and generating a certain phase difference among the plurality of discrete or digital sampled signals when the RF signal is down-converted by using sample clock signals that are variably offset in time between the tracks; and
removing an image component from the plurality of sampled signals using the generated phase difference.

17. The digital direct conversion receiving method of claim 16, further comprising:
generating clock signals having different time differences,
wherein the generating of the certain phase difference comprises:
generating the phase difference using the generated clock signals.

18. The digital direct conversion receiving method of claim 16, further comprising:
digital-converting the plurality of sampled signals with the generated phase difference, and generating sample streams with different phase differences,
wherein the removing of the image component comprises:
combining the generated sample streams and removing the image component with a negative frequency band from the combined sample streams.

19. The digital direct conversion receiving method of claim 18, wherein the generating of the sample streams comprises:
performing digital conversion at a sampling rate which is at least twice as wide as a bandwidth of the RF signal.

20. A digital direct conversion receiving apparatus, comprising:
a first phase conversion unit to generate a discrete or digital sampled signal 1 with a phase difference by down-converting a radio frequency (RF) signal;
a second phase conversion unit to generate a discrete or digital sampled signal 2 with the phase difference by down-converting the RF signal;
a first digitization unit to generate a stream 1 by performing quantization of the sampled signal 1 generated by the first phase conversion unit;
a second digitization unit to generate a stream 2 by performing quantization of the sampled signal 2 generated by the second phase conversion unit; and
a variable complex gain unit to remove an image component with a negative frequency band by combining the stream 1 and the stream 2 by using sample clock signals that are variably offset in time between the stream1 and the stream2.

* * * * *